(12) United States Patent
Itoh et al.

(10) Patent No.: US 6,327,166 B1
(45) Date of Patent: Dec. 4, 2001

(54) SEMICONDUCTOR DEVICE

(75) Inventors: Niichi Itoh; Yasunobu Nakase; Tetsuya Watanabe; Chikayoshi Morishima, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/651,322

(22) Filed: Aug. 31, 2000

Related U.S. Application Data

(63) Continuation of application No. 09/401,185, filed on Sep. 23, 1999, now Pat. No. 6,128,208.

(30) Foreign Application Priority Data

Aug. 27, 1999 (JP) ................................................ P11-241122

(51) Int. Cl.[7] ...................................................... G11C 5/02
(52) U.S. Cl. .............................. 365/51; 365/52; 365/210; 257/390
(58) Field of Search ............................... 365/51, 52, 210; 257/390

(56) References Cited

U.S. PATENT DOCUMENTS

| 4,855,956 | 8/1989 | Urai . |
| 5,105,385 | 4/1992 | Ohtsuka et al. . |
| 5,377,136 | * 12/1994 | Nishio et al. ............................ 365/51 |
| 5,534,724 | * 7/1996 | Nagamine ............................. 257/390 |

FOREIGN PATENT DOCUMENTS 4-93069    3/1992 (JP) .

OTHER PUBLICATIONS

Information on the Product Shipped.

* cited by examiner

Primary Examiner—Huan Hoang
(74) Attorney, Agent, or Firm—Oblon, Spivak, McClelland, Maier & Neustadt, P.C.

(57) ABSTRACT

Provided is a semiconductor memory having a layout structure in which a memory cell has excellent patterning controllability. A pattern of element components (active regions 10 to 15 and 21 to 23 and polysilicon regions 31 to 42) of a memory cell for one memory cell unit of a memory cell array region 1 is identical to that of a dummy cell of a peripheral dummy cell region 3, and both patterns present a line symmetrical relationship with respect to a boundary line BC1. In addition, a pattern of the memory cell for one memory cell unit of the memory cell array region 1 is identical to that of a dummy cell of a power wiring region 2, and both patterns present a line symmetrical relationship with respect to a boundary line BC2.

11 Claims, 13 Drawing Sheets

SEMICONDUCTOR DEVICE

This application is a continuation of application Ser. No. 09/401,185, filed Sep. 23, 1999, now U.S. Pat. No. 6,128, 208.

BACKGROUND OF THE INVENTION

1. Field of the Invention

The present invention relates to a semiconductor device, and more particularly to a layout pattern of a memory cell array region having a memory cell and a peripheral region thereof.

2. Description of the Background Art

A memory cell array structure of a conventional semiconductor device having a DRAM and the like includes a plurality of memory cells arranged in a matrix. One power wiring is inserted and provided in every predetermined number of memory cells. The power wiring is a power wiring for power supply which serves to enhance supply capabilities of a source potential or a ground potential (GND) by relatively increasing a formation width, and is usually formed of metal such as aluminum, copper or the like. The power wiring is formed in a power wiring region which is specially provided for forming only the power wiring.

In the power wiring region, an element such as a transistor is not formed in an area positioned under the power wiring. Therefore, a difference between coarse and fine portions is made on a mask pattern for forming a memory cell between the memory cell array region where a plurality of memory cells are formed and the power wiring region. In the mask pattern for forming a memory cell, a pattern width of the power wiring region where the memory cell is not formed at all becomes much larger than a pattern width of the memory cell array region.

In the case where a resist is subjected to patterning with a mask pattern in which the difference between coarse and fine portions is thus made remarkably after an exposing step using a photomask, there has been the following drawback. More specifically, uneven irradiation is generated by various phenomena such as diffraction interference of light and the like so that a pattern boundary becomes blurred. For this reason, the patterning cannot be performed with high precision. Thus, the patterning controllability of a memory cell is deteriorated.

Moreover, a difference between coarse and fine portions is usually made on the mask pattern for forming a memory cell between the memory cell array region and a peripheral portion thereof (where the memory cell is not formed). Therefore, there has been the drawback that the patterning controllability of the memory cell is deteriorated as described above.

SUMMARY OF THE INVENTION

In order to solve the above-mentioned problems, it is an object of the present invention to provide a semiconductor device having a layout structure in which a memory cell has excellent patterning controllability.

A first aspect of the present invention is directed to a semiconductor device comprising a semiconductor substrate, a memory cell array region formed on the semiconductor substrate and having a memory cell provided in an array, and a memory cell array adjacent region provided on the semiconductor substrate adjacently to the memory cell array region and having a dummy cell, wherein a pattern of at least a part of the dummy cell of the memory cell array adjacent region is formed to have a line symmetrical relationship with a pattern of at least a part of the memory cell with respect to a boundary line between the memory cell array region and the memory cell array adjacent region in a vicinal region of the boundary line.

A second aspect of the present invention is directed to the semiconductor device according to the first aspect of the present invention, wherein the dummy cell is formed with the same pattern as the memory cell, the same pattern including a normal image and a mirror image.

A third aspect of the present invention is directed to the semiconductor device according to the first or second aspect of the present invention, wherein the dummy cell includes a substrate potential setting portion capable of setting a substrate potential of the semiconductor substrate to a fixed potential.

A fourth aspect of the present invention is directed to a semiconductor device comprising a semiconductor substrate, a memory cell array region formed on the semiconductor substrate and having a memory cell provided in an array, and a power wiring region provided on the semiconductor substrate adjacently to the memory cell array region and having a power wiring for power supply provided thereon, wherein the power wiring region includes a dummy cell having a pattern dimension equal to a pattern dimension of the memory cell.

A fifth aspect of the present invention is directed to the semiconductor device according to the fourth aspect of the present invention, wherein a pattern of at least a part of the dummy cell is formed to have a line symmetrical relationship with a pattern of at least a part of the memory cell with respect to a boundary line between the memory cell array region and the power wiring region in a vicinal region of the boundary line.

A sixth aspect of the present invention is directed to the semiconductor device according to the fourth or fifth aspect of the present invention, wherein the dummy cell is formed with the same pattern as the memory cell, the same pattern including a normal image and a mirror image.

A seventh aspect of the present invention is directed to the semiconductor device according to any of the fourth to sixth aspects of the present invention, wherein the dummy cell includes a substrate potential setting portion which is electrically connected to the power wiring and can set a substrate potential of the semiconductor substrate to a potential of the power wiring.

According to the first aspect of the present invention, as described above, the memory cell array adjacent region of the semiconductor device forms the dummy cell having a pattern which is line symmetrical with the pattern of at least a part of the memory cell with respect to the boundary line between the memory cell array region and the memory cell array adjacent region in the vicinal region of the boundary line. Consequently, a difference between coarse and fine portions of the pattern dimension of the mask for forming a memory cell is not made at all in the vicinal region of the boundary line between the memory cell array region and the power region. Therefore, the patterning controllability of the memory cell can be enhanced.

According to the second aspect of the present invention, the dummy cell is formed with the same pattern as the pattern of the memory cell including a normal image and a mirror image. Consequently, a difference between coarse and fine portions of the pattern of the mask for forming a memory cell is not made at all between the memory cell array region and the memory cell array adjacent region. Therefore, the patterning controllability of the memory cell can be enhanced.

According to the third aspect of the present invention, the dummy cell includes the substrate potential setting portion capable of setting the substrate potential of the semiconductor substrate to the fixed potential. Therefore, the substrate potential fixation of the semiconductor substrate can be performed and the stability of a circuit operation can be enhanced.

According to the fourth aspect of the present invention, the power wiring region provided on the semiconductor substrate adjacently to the memory cell array region includes the dummy cell having a pattern dimension equal to a pattern dimension of the memory cell. Therefore, the pattern dimension of the mask for forming a memory cell is identical between the memory cell array region and the power region.

Accordingly, a difference between coarse and fine portions of the pattern of the mask for forming a memory cell is rarely made between the memory cell array region and the power region. Consequently, the patterning controllability of the memory cell can be enhanced.

According to the fifth aspect of the present invention, the semiconductor device forms the dummy cell having a pattern which is line symmetrical with the pattern of at least a part of the memory cell with respect to the boundary line between the memory cell array region and the power wiring region in the vicinal region of the boundary line. Consequently, a difference between coarse and fine portions of the pattern dimension of the mask for forming a memory cell is not made at all in the vicinal region of the boundary line between the memory cell array region and the power region. Therefore, the patterning controllability of the memory cell can be enhanced still more.

According to the sixth aspect of the present invention, the dummy cell is formed with the same pattern as the pattern of the memory cell including a normal image and a mirror image. Consequently, a difference between coarse and fine portions of the pattern of the mask for forming a memory cell is not made at all between the memory cell array region and the power region. Therefore, the patterning controllability of the memory cell can be enhanced.

The pattern of the memory cell of the memory cell array region is identical to the pattern of the dummy cell of the power region including a normal image and a mirror image. Therefore, the memory cell array region and the power region can properly be changed during manufacture. Thus, the manufacture can be performed with flexibility.

According to the seventh aspect of the present invention, the dummy cell includes the substrate potential setting portion capable of setting the substrate potential of the semiconductor substrate to the electric potential of the power wiring. Therefore, the substrate potential fixation of the semiconductor substrate can be performed and the stability of a circuit operation can also be enhanced.

These and other objects, features, aspects and advantages of the present invention will become more apparent from the following detailed description of the present invention when taken in conjunction with the accompanying drawings.

DESCRIPTION OF THE PREFERRED EMBODIMENTS

<<First Embodiment>>
<Whole Structure>

Figure 1:
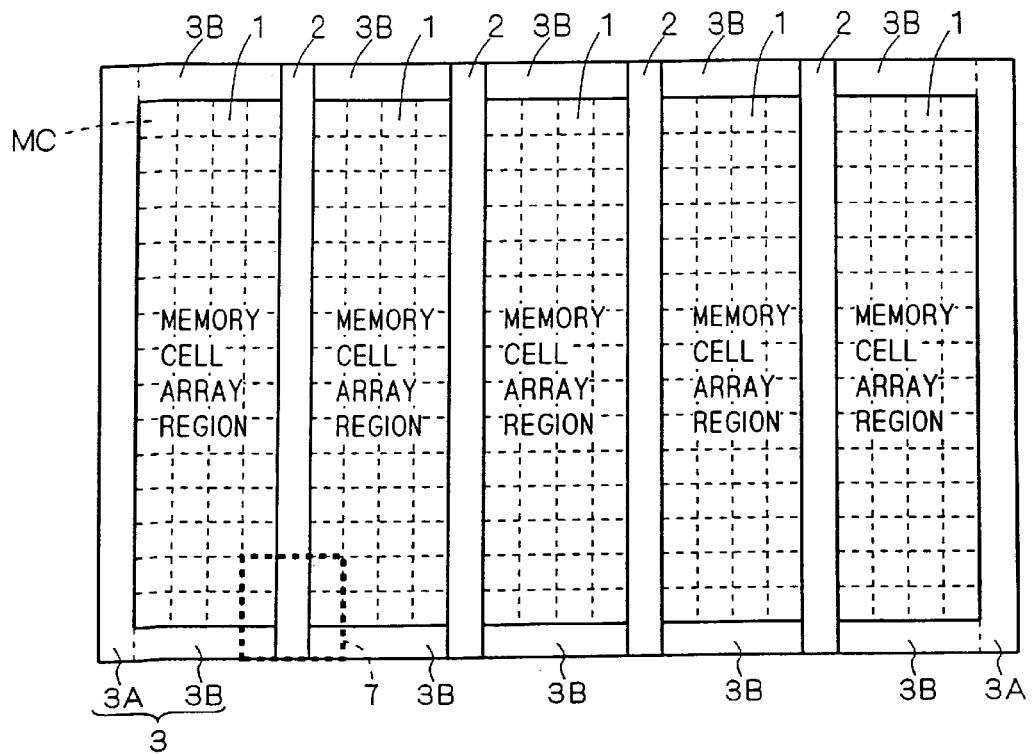
FIG. 1 is a diagram showing the whole layout structure of a semiconductor memory (DRAM) according to a first embodiment of the present invention.

FIG. 1 is a diagram showing the whole layout structure of a semiconductor device (comprising a DRAM) according to a first embodiment of the present invention. As shown in FIG. 1, a plurality of memory cell array regions 1, a plurality of power wiring regions 2 and a plurality of peripheral dummy cell regions 3 are provided in a layout on a p-type substrate which is not shown. The memory cell array region 1 and the power wiring region 2 are alternately provided adjacently to each other. More specifically, layout arrangement is carried out such that the power wiring region 2 is always inserted between the memory cell array regions 1, 1. Moreover, the peripheral dummy cell region 3 is provided adjacently to the memory cell array region 1 on a periphery of the memory cell array region 1 where the power wiring region 2 is not formed.

A plurality of memory cells MC are provided in an array in the memory cell array regions 1, respectively.

Figure 2:
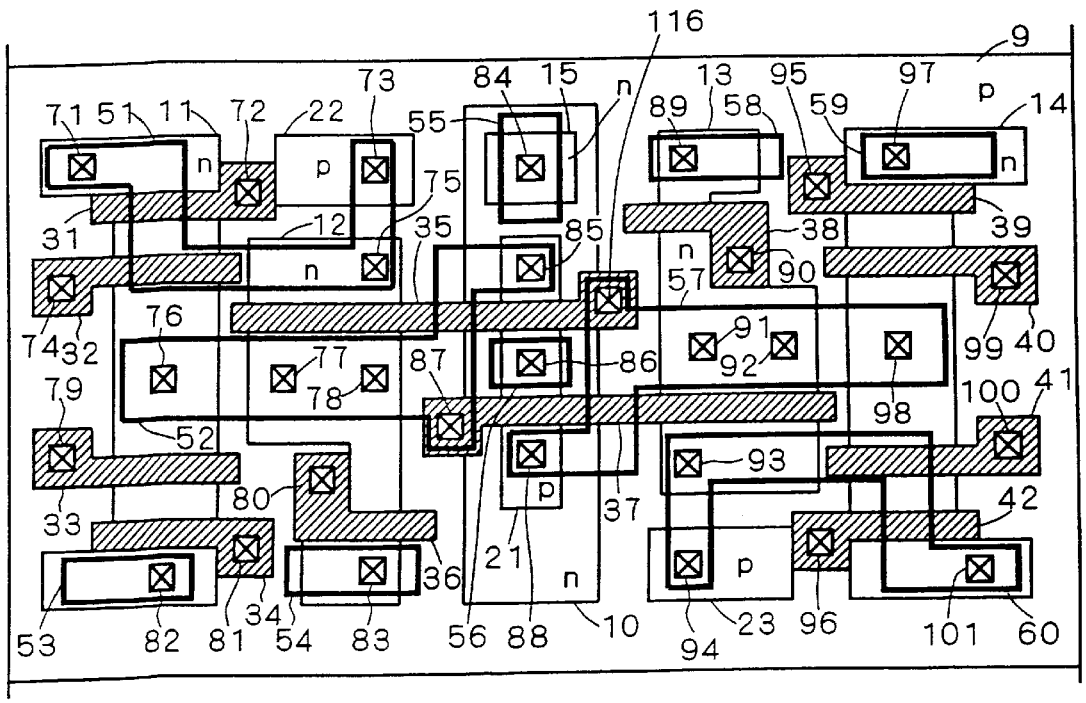
FIG. 2 is a plan view showing a layout pattern corresponding to one memory cell unit in a memory cell region.

The peripheral dummy cell region 3 is constituted by first partial dummy cell regions 3A provided adjacently to each other in a row direction (a transverse direction in FIG. 1) and second partial dummy cell regions 3B provided adjacently to each other in a column direction (a longitudinal direction in FIG. 2).

<Layout of Memory Cell Region>

FIG. 2 is a plan view showing an example of a layout pattern corresponding to one memory cell unit in the memory cell array region 1.

As shown in FIG. 2, an n well region 10, n-type active regions 11 to 14 and p-type active regions 22 and 23 are selectively formed in a p-type substrate 9, and an n-type active region 15 and a p-type active region 21 are selectively formed in the n well region 10.

Polysilicon regions 31 to 34 are selectively formed on the n-type active region 11, polysilicon regions 35 and 36 are selectively formed on the n-type active region 12, polysilicon regions 35 and 37 are selectively formed on the p-type active region 21, polysilicon regions 37 and 38 are selectively formed on the n-type active region 13, and polysilicon regions 39 to 42 are selectively formed on the n-type active region 14.

The polysilicon region is formed in an upper layer part of the active region, and impurities are injected into the active region after the polysilicon region is formed. Therefore, the active region provided under the polysilicon region has a conductivity type which is reverse to the conductivity type of other regions. For example, the n-type active region 11 provided under the polysilicon region 31 has a p conductivity type (which is a conductivity type of the p-type substrate 9), and the p-type active region 21 provided under the polysilicon region 35 has an n conductivity type (which is a conductivity type of the n well region 10).

A region comprising the n well region 10, the n-type active regions 11 to 15, the p-type active regions 21 to 23 and the polysilicon regions 31 to 42 has a layout of element components constituting a one-unit memory cell.

Furthermore, metal wiring regions 51 to 60 such as aluminum (which will be hereinafter referred to as "aluminum wiring regions") are selectively formed on a first layer over the n well region 10. The aluminum wiring region 51 is electrically connected through a contact hole 71 to one adjacent region which is adjacent to the polysilicon region 31 in the n-type active region 11 in one direction (upward in FIG. 2), is electrically connected through a contact hole 75 to one adjacent region to the polysilicon region 35 in the n-type active region 12, and is electrically connected to the p-type active region 22 through a contact hole 73.

The aluminum wiring region 52 is electrically connected through a contact hole 76 to a lower adjacent region adjacent to the polysilicon region 32 in the n-type active region 11 in the other direction (downward in FIG. 2) (that is, one adjacent region to the polysilicon region 33), is electrically connected through contact holes 77 and 78 to the other adjacent region to the polysilicon region 35 in the n-type active region 12, is electrically connected through a contact hole 85 to one adjacent region to the polysilicon region 35 in the p-type active region 21, and is electrically connected to the polysilicon region 37 through a contact hole 87.

The aluminum wiring region 53 is electrically connected through a contact hole 82 to the other adjacent region to the polysilicon region 34 in the n-type active region 11. The aluminum wiring region 54 is electrically connected through a contact hole 83 to the other adjacent region to the polysilicon region 36 in the n-type active region 12. The aluminum wiring region 55 is electrically connected to the n-type active region 15 through a contact hole 84. The aluminum wiring region 56 is electrically connected through a contact hole 86 to the other adjacent region to the polysilicon region 35 in the p-type active region 21 (that is, one adjacent region to the polysilicon region 37).

The aluminum wiring region 57 is electrically connected through a contact hole 88 to the other adjacent region to the polysilicon region 37 in the p-type active region 21, is electrically connected to the polysilicon region 35 through a contact hole 116, is electrically connected through contact holes 91 and 92 to the other adjacent region to the polysilicon region 38 in the n-type active region 13 (that is, one adjacent region to the polysilicon region 37), and is electrically connected through a contact hole 98 to the other adjacent region to the polysilicon region 40 in the n-type active region 14 (that is, one adjacent region to the polysilicon region 41).

The aluminum wiring region 58 is electrically connected through a contact hole 89 to one adjacent region to the polysilicon region 38 in the n-type active region 13. The aluminum wiring region 59 is electrically connected through a contact hole 97 to one adjacent region to the polysilicon region 39 in the n-type active region 14.

The aluminum wiring region 60 is electrically connected through a contact hole 93 to the other adjacent region to the polysilicon region 37 in the n-type active region 13, is electrically connected to the p-type active region 23 through a contact hole 94, and is electrically connected through a contact hole 101 to the other adjacent region to the polysilicon region 42 in the n-type active region 14.

The contact holes 72, 74, 79, 81, 80, 90, 95, 99, 100 and 96 are provided to perform an electrical connection of the respective polysilicon regions 31, 32, 33, 34, 36, 38, 39, 40, 41 and 42 to wiring regions which are not shown.

A layout of element components having the same pattern as the pattern shown in FIG. 2 is arranged in an array in the memory cell array region 1 including normal image and mirror image patterns for a basic pattern of one memory cell unit shown in FIG. 2.

Figure 3:
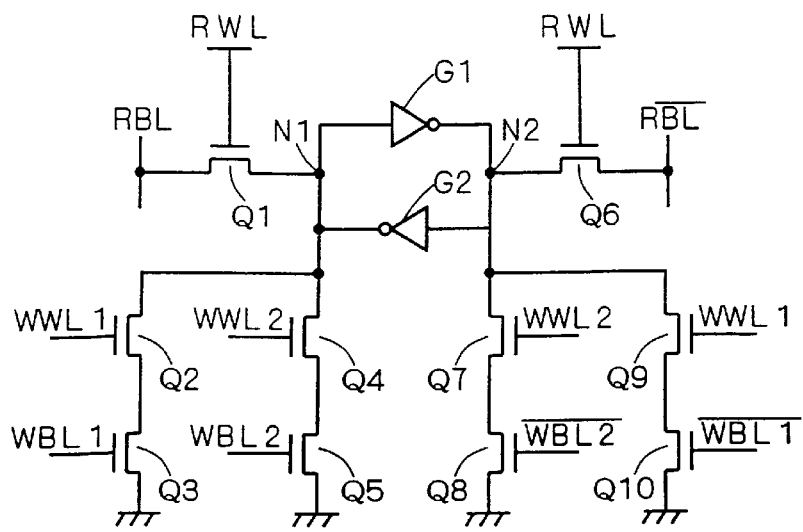
FIG. 3 is a circuit diagram showing an equivalent circuit of a memory cell having a layout structure of the memory cell region in FIG. 2.

FIG. 3 is a circuit diagram showing an equivalent circuit of a memory cell having the layout structure of FIG. 2. There is illustrated a three-port structure comprising two write ports and one read port in the memory cell shown in FIG. 2.

As shown in FIG. 3, an NMOS transistor Q1 has a drain connected to a read bit line RBL, a gate connected to a read word line RWL and a source connected to a node N1.

An NMOS transistor Q2 has a drain connected to the node N1, a gate connected to a write word line WWL1 and a source connected to a drain of an NMOS transistor Q3. The NMOS transistor Q3 has a gate connected to a write bit line WBL1 and a source grounded.

An NMOS transistor Q4 has a drain connected to the node N1, a gate connected to a write word line WWL2 and a source connected to a drain of an NMOS transistor Q5. The NMOS transistor Q5 has a gate connected to a write bit line WBL2 and a source grounded.

A CMOS inverter G1 has an input portion connected to the node N1 and an output portion connected to a node N2. A CMOS inverter G2 has an input portion connected to the node N2 and an output portion connected to the node N1. Accordingly, the CMOS inverters G1 and G2 are loop-connected to each other so that information can be stored.

An NMOS transistor Q6 has a drain connected to an inverting read bit line $\overline{RBL}$, a gate connected to the read word line RWL and a source connected to the node N2.

An NMOS transistor Q7 has a drain connected to the node N2, a gate connected to the write word line WWL2 and a source connected to a drain of an NMOS transistor Q8. The NMOS transistor Q8 has a gate connected to an inverting write bit line $\overline{WBL2}$ and a source grounded.

An NMOS transistor Q9 has a drain connected to the node N2, a gate connected to the write word line WWL1, and a source connected to a drain of an NMOS transistor Q10. The NMOS transistor Q10 has a gate connected to an inverting write bit line $\overline{WBL1}$ and a source grounded.

A layout part of FIG. 2 which corresponds to the NMOS transistors Q1 to Q10 and the CMOS inverters G1 and G2 shown in FIG. 3 will be described below.

The NMOS transistor Q1 is equivalent to an NMOS transistor constituted by the polysilicon region 36 and the n-type active region 12 adjacent to one of sides of the polysilicon region 36 and the other side thereof. More specifically, the NMOS transistor Q1 is equivalent to a MOS transistor in which the polysilicon region 36 acts as a gate electrode and the n-type active region 12 adjacent to the gate electrode acts as a drain/source region. The aluminum wiring region 54 functions as the read bit line RBL.

The NMOS transistor Q2 is equivalent to an NMOS transistor constituted by the polysilicon region 32 and the n-type active region 11 adjacent to one of sides of the polysilicon region 32 and the other side thereof, and the NMOS transistor Q3 is equivalent to an NMOS transistor constituted by the polysilicon region 31 and the n-type active region 11 adjacent to one of sides of the polysilicon region 31 and the other side thereof. The aluminum wiring region 51 functions as a grounding wire.

The NMOS transistor Q4 is equivalent to an NMOS transistor constituted by the polysilicon region 33 and the n-type active region 11 adjacent to one of sides of the polysilicon region 33 and the other side thereof, and the NMOS transistor Q5 is equivalent to an NMOS transistor constituted by the polysilicon region 34 and the n-type active region 11 adjacent to one of sides of the polysilicon region 34 and the other side thereof. The aluminum wiring region 53 functions as a grounding wire.

The NMOS transistor Q6 is equivalent to an NMOS transistor constituted by the polysilicon region 38 and the n-type active region 13 adjacent to one of sides of the polysilicon region 38 and the other side thereof, the aluminum wiring region 58 functions as the inverting read bit line $\overline{RBL}$, and the read word line RWL is electrically connected to the polysilicon region 38.

The NMOS transistor Q7 is equivalent to an NMOS transistor constituted by the polysilicon region 41 and the n-type active region 14 adjacent to one of sides of the polysilicon region 41 and the other side thereof, and the NMOS transistor Q8 is equivalent to an NMOS transistor constituted by the polysilicon region 42 and the n-type active region 14 adjacent to one of sides of the polysilicon region 42 and the other side thereof. The aluminum wiring region 60 functions as a grounding wire.

The NMOS transistor Q9 is equivalent to an NMOS transistor constituted by the polysilicon region 40 and the n-type active region 14 adjacent to one of sides of the polysilicon region 40 and the other side thereof, and the NMOS transistor Q10 is equivalent to an NMOS transistor constituted by the polysilicon region 39 and the n-type active region 14 adjacent to one of sides of the polysilicon region 39 and the other side thereof. The aluminum wiring region 59 functions as a grounding wire.

The CMOS inverter G1 is equivalent to a combination of an NMOS transistor constituted by the polysilicon region 37 and the n-type active region 13 adjacent to one of sides of the polysilicon region 37 and the other side thereof, a PMOS transistor constituted by the polysilicon region 37 and the p-type active region 21 adjacent to one of sides of the polysilicon region 37 and the other side thereof, and the aluminum wiring region 57 for electrically connecting a drain of the PMOS transistor to a drain of the NMOS transistor. The aluminum wiring region 57 also serves as the node N2.

The CMOS inverter G2 is equivalent to a combination of an NMOS transistor constituted by the polysilicon region 35 and the n-type active region 12 adjacent to one of sides of the polysilicon region 35 and other side thereof, a PMOS transistor constituted by the polysilicon region 35 and the p-type active region 21 adjacent to one of sides of the polysilicon region 35 and the other side thereof, and the aluminum wiring region 52 for electrically connecting a drain of the PMOS transistor to a drain of the NMOS transistor. The aluminum wiring region 52 also serves as the node N1.

The read word line RWL is electrically connected to the polysilicon regions 36 and 38, the write word line WWL1 is electrically connected to the polysilicon regions 32 and 40, the write bit line WBL1 is electrically connected to the polysilicon region 31, the inverting write bit line $\overline{WBL1}$ is electrically connected to the polysilicon region 39, the write word line WWL2 is electrically connected to the polysilicon regions 33 and 41, the write bit line WBL2 is electrically connected to the polysilicon region 34, and the inverting write bit line $\overline{WBL2}$ is electrically connected to the polysilicon region 42, thereby obtaining the same structure as in the equivalent circuit of FIG. 3, which is not shown in FIG. 2.

<Layout of Power Wiring Region>

Figure 4:
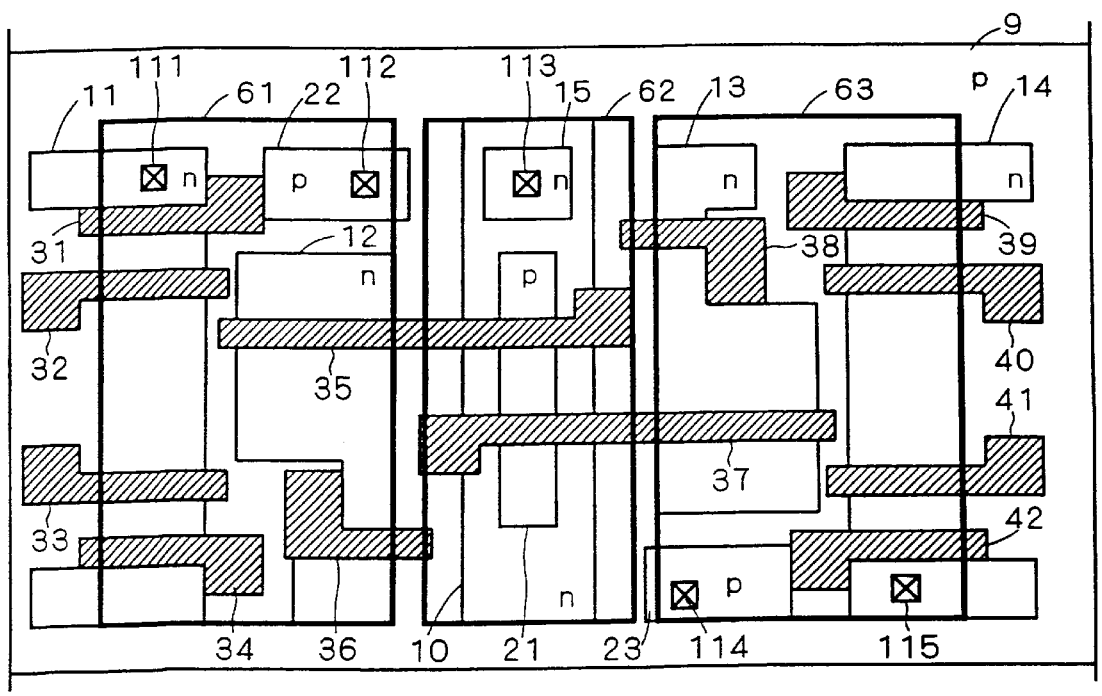
FIG. 4 is a plan view showing a layout structure in a region corresponding to one memory cell unit formed in a power wiring region.

FIG. 4 is a plan view showing a layout structure of a dummy cell corresponding to one memory cell unit formed in the power wiring region 2 illustrated in FIG. 1.

Since a layout structure of a dummy cell comprising an n well region 10, n-type active regions 11 to 15, p-type active regions 21 to 23 and polysilicon regions 31 to 42 which are formed on a p-type substrate 9 is the same as the layout structure of the memory cell for one memory cell unit of the memory cell array region 1 shown in FIG. 2 including a normal image and a mirror image, it has the same reference numerals.

An aluminum wiring region 61 is formed on most of the n-type active region 11, the n-type active region 12 and the p-type active region 22, is electrically connected to the n-type active region 11 through a contact hole 111 and is electrically connected to the p-type active region 22 through a contact hole 112.

An aluminum wiring region 62 is formed on a region including the n well region 10, and is electrically connected to the n-type active region 15 through a contact hole 113.

An aluminum wiring region 63 is formed on most of the n-type active region 13, the n-type active region 14 and the p-type active region 23, is electrically connected to the p-type active region 23 through a contact hole 114 and is electrically connected to the n-type active region 14 through a contact hole 115.

The aluminum wiring regions 61 to 63 are formed on a first layer, the aluminum wiring regions 61 and 63 function as a power wiring for setting a ground potential GND and the aluminum wiring region 62 functions as a power wiring for setting a source potential. Moreover, the aluminum wiring region 62 is connected to another aluminum wiring provided on a second layer (provided on the first layer) having a great width from a left edge of the aluminum wiring region 61 to a right edge of the aluminum wiring region 63 by means of a via hole (through hole) for electrically connecting the first layer to the second layer, which is not shown in FIG. 4.

Accordingly, the substrate potential fixation of the p-type substrate 9 can be implemented by performing the GND potential fixation of the p-type active regions 22 and 23 through the aluminum wiring regions 61 and 63, the electric potential fixation of a region corresponding to a drain/source region of a transistor can be implemented by performing the GND potential fixation of the n-type active regions 11 and 14 through the aluminum wiring regions 61 and 63, and the electric potential fixation of the n well region 10 can be implemented by performing the source potential fixation of the n-type active region 15 through the aluminum wiring region 62.

A dummy cell region having the same pattern as the shape shown in FIG. 4 is formed in the power wiring region 2 adjacently in the column direction including normal image and mirror image patterns for the basic pattern of the dummy cell corresponding to one memory cell unit shown in FIG. 4.

<Layout of Peripheral Dummy Cell Region>

Figure 5:
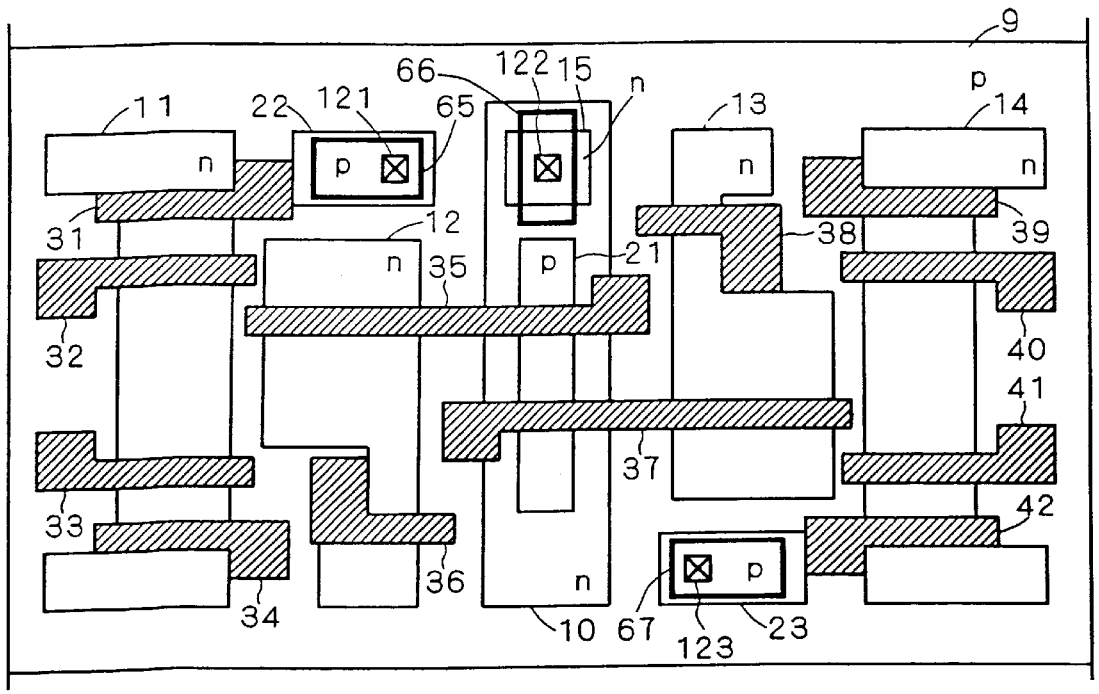
FIG. 5 is a plan view showing a (first) layout structure of a region corresponding to one memory cell unit formed in a peripheral dummy cell region.

FIG. 5 is a plan view showing a (first) layout structure of a region corresponding to one memory cell unit formed in the peripheral dummy cell region 3 shown in FIG. 1.

Since the layout structure of a dummy cell comprising an n well region 10, n-type active regions 11 to 15, dummy cell regions 21 to 23 and polysilicon regions 31 to 42 which are formed on a p-type substrate 9 is the same as the layout structure of the memory cell for one memory cell unit of the memory cell array region 1 shown in FIG. 2 including a normal image and a mirror image, it has the same reference numerals.

An aluminum wiring region 65 is electrically connected to the p-type active region 22 through a contact hole 121. An aluminum wiring region 66 is electrically connected to the n-type active region 15 through a contact hole 122. An aluminum wiring region 67 is electrically connected to the p-type active region 23 through a contact hole 123.

The aluminum wiring regions 65 to 67 are formed on a first layer and serve to set a ground potential GND. Accordingly, the substrate potential fixation of the p-type substrate 9 can be implemented by performing the ground potential GND fixation of the p-type active regions 22 and 23 through the aluminum wiring regions 65 and 67, and the electric potential fixation of the n well region 10 can be implemented by performing the ground potential GND fixation of the n-type active region 15 through the aluminum wiring region 66.

Figure 6:
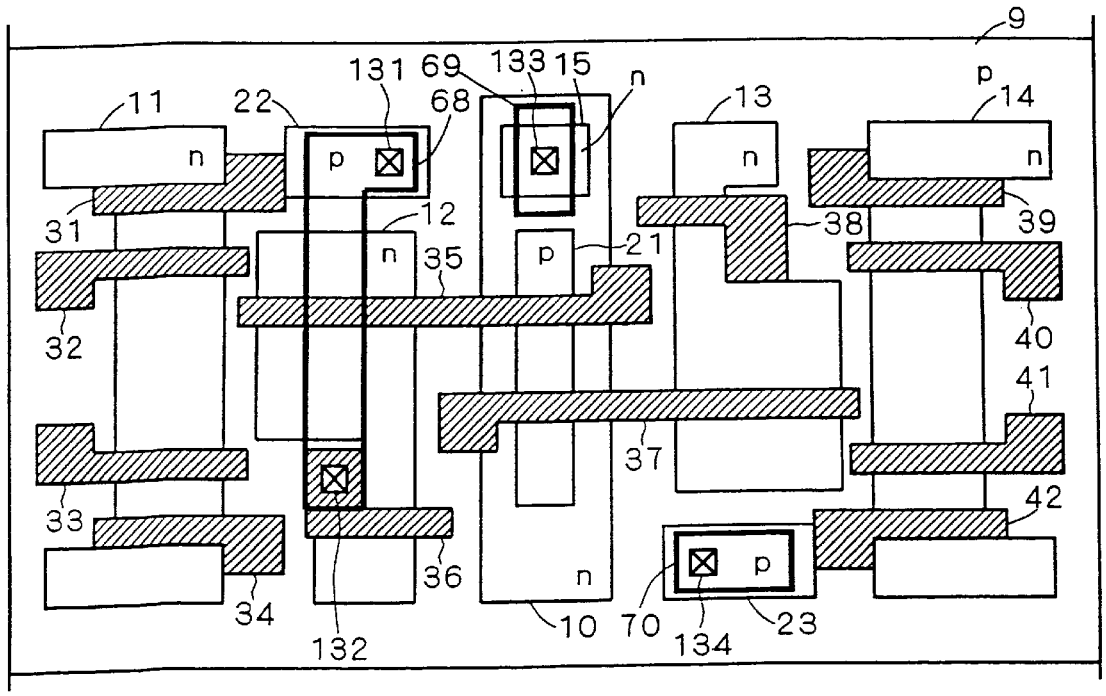
FIG. 6. is a plan view showing a (second) layout structure of the region corresponding to one memory cell unit formed in the peripheral dummy cell region.
Figure 7:
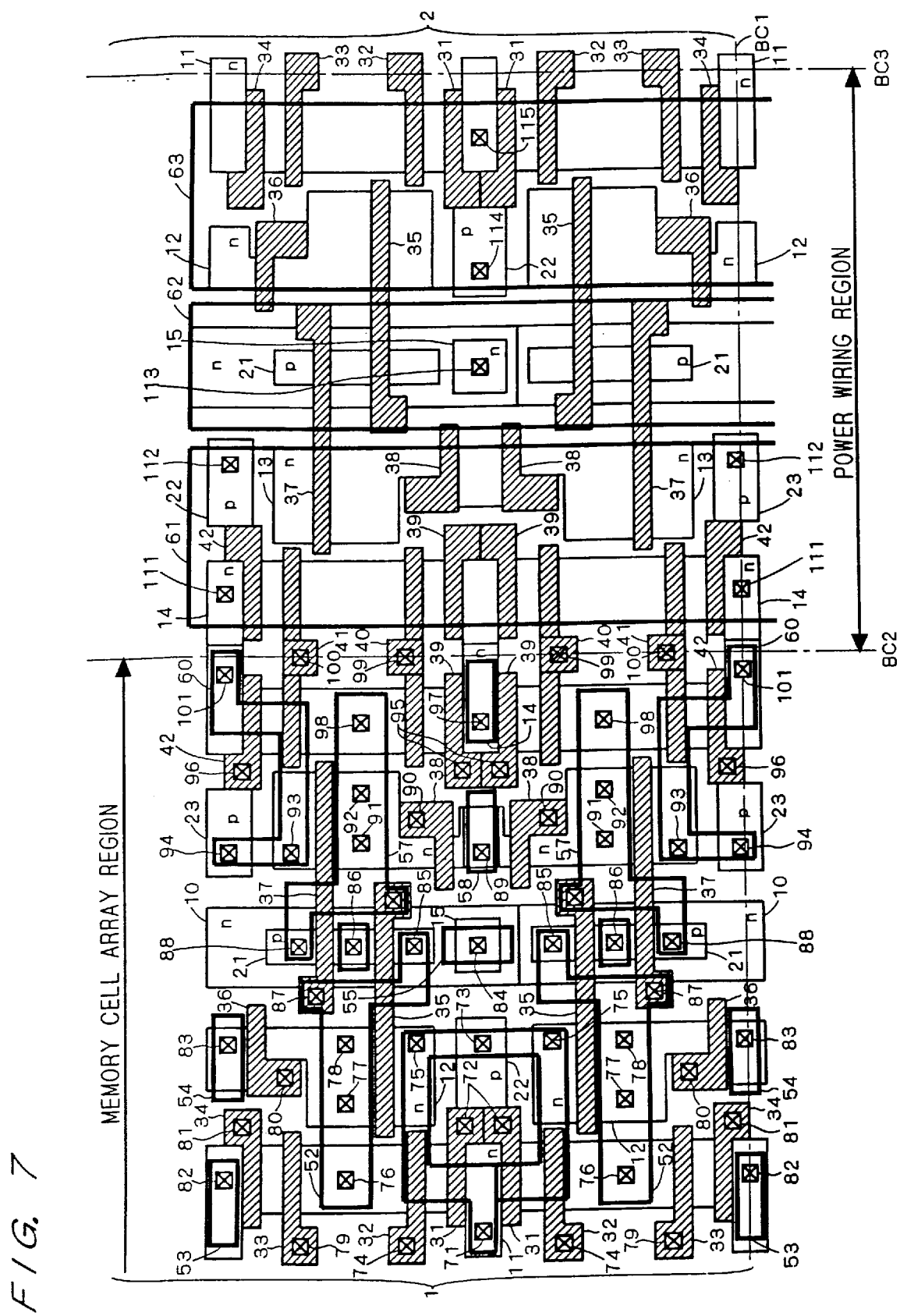
FIGS. 7 to 10 are plan views showing the details of a partial layout structure according to the first embodiment, including the memory cell region, the power wiring region and the peripheral dummy cell region.
Figure 8:
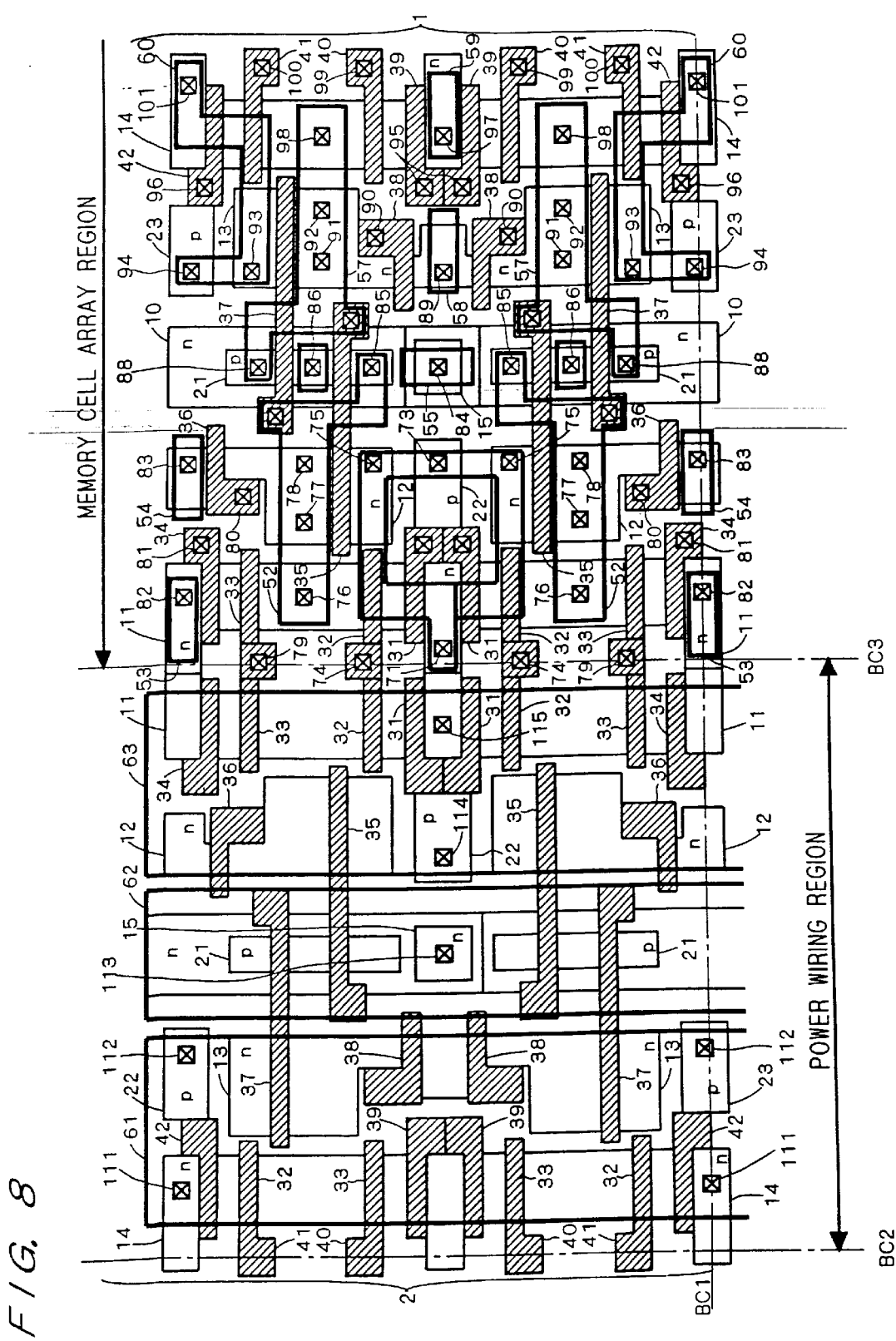
Figure 9:
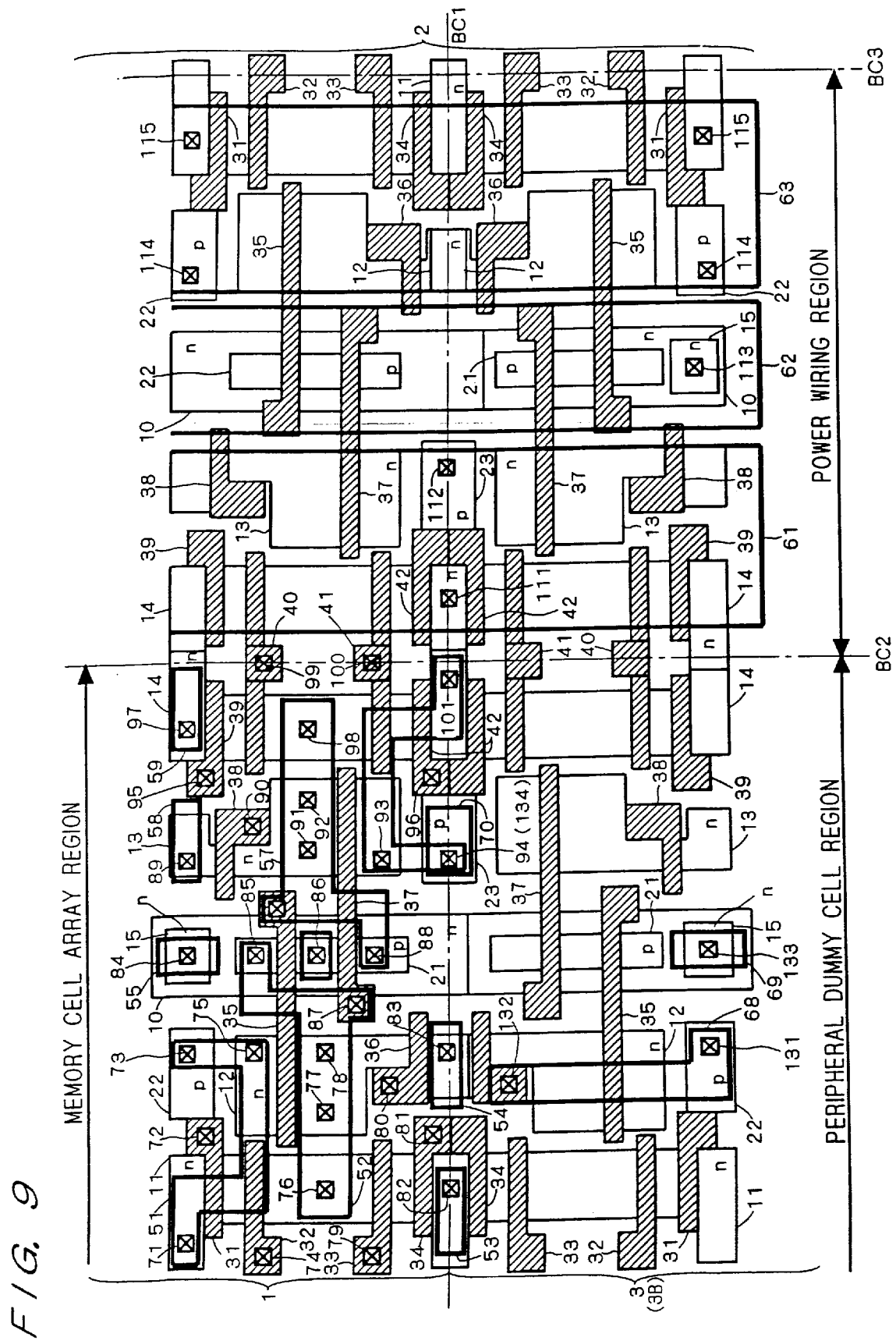
Figure 10:
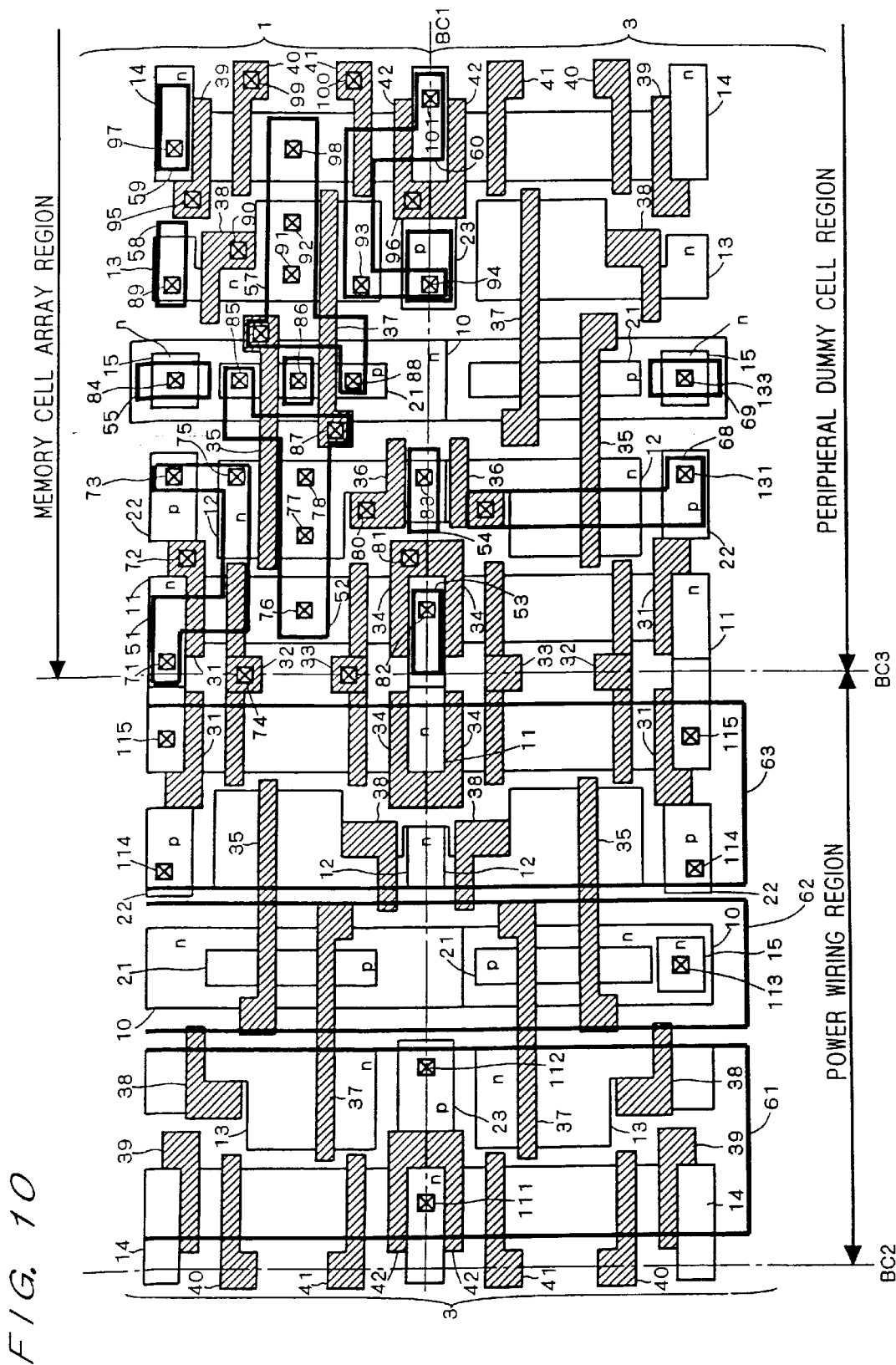

FIG. 6 is a plan view showing a (second) layout structure of a region corresponding to one memory cell unit formed in the peripheral dummy cell region 3 shown in FIG. 1.

Since the layout structure of a dummy cell comprising an n well region 10, n-type active regions 11 to 15, p-type active regions 21 to 23 and polysilicon regions 31 to 42 which are formed on a p-type substrate 9 is the same as the layout structure of the memory cell for one memory cell unit of the memory cell array region 1 shown in FIG. 2 including a normal image and a mirror image, it has the same reference numerals.

An aluminum wiring region 68 is electrically connected to the p-type active region 21 through a contact hole 131 and is electrically connected to the polysilicon region 36 through a contact hole 132.

An aluminum wiring region 69 is electrically connected to the n-type active region 15 through a contact hole 133. An aluminum wiring region 70 is electrically connected to the p-type active region 23 through a contact hole 134.

The aluminum wiring regions 68 to 70 are formed on a first layer and serve to set a ground potential GND. Accordingly, the substrate potential fixation of the p-type substrate 9 can be implemented by performing the ground potential GND fixation of the p-type active regions 22 and 23 through the aluminum wiring regions 68 and 70, the electric potential fixation of the n well region 10 can be implemented by performing the ground potential GND fixation of the n-type active region 15 through the aluminum wiring region 69, and the electric potential fixation of a region corresponding to a gate electrode of a MOS transistor can be implemented by performing the ground potential GND fixation of the polysilicon region 36 through the aluminum wiring region 68.

Dummy cell regions having the same shapes as the shapes shown in FIGS. 5 and 6 are formed in the first and second partial dummy cell regions 3A and 3B of the peripheral dummy cell region 3 adjacently to each other in column and row directions including normal image and mirror image patterns for the basic pattern of the dummy cell corresponding to one memory cell unit shown in FIGS. 5 and 6.

<Partial Layout>

Figure 11:
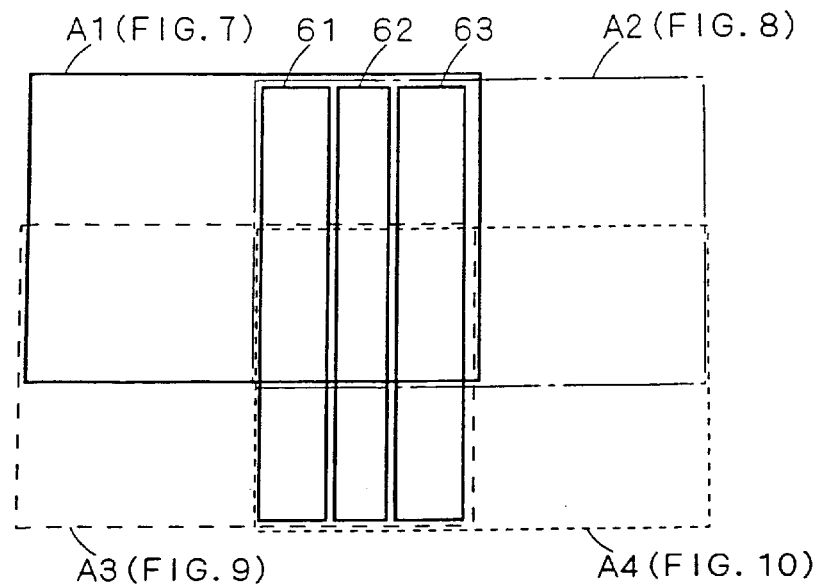
FIG. 11 is a diagram illustrating a positional relationship among FIGS. 7 to 10.

FIGS. 7 to 10 are plan views showing a partial layout structure including the memory cell array region 1, the power wiring region 2 and the peripheral dummy cell region 3. Partial layout regions shown in FIGS. 7 to 10 are equivalent to the partial region 7 shown in FIG. 1, for example. A positional relationship among FIGS. 7 to 10 is shown in FIG. 11.

As shown in FIGS. 7 to 10, the memory cell array region 1 and the power wiring region 2 are adjacent to each other through a boundary line BC2 and a boundary line BC3, and the memory cell array region 1 and the peripheral dummy cell region 3 (the second partial dummy cell region 3B) are adjacent to each other through a boundary line BC1.

A pattern of a layout of element components (the active regions 10 to 15 and 21 to 23 and the polysilicon regions 31 to 42) of the memory cell for one memory cell unit of the memory cell array region 1 is identical to a pattern of a dummy cell of the peripheral dummy cell region 3 including a normal image and a mirror image, and both patterns present a line symmetrical relationship with respect to the boundary line BC1.

In addition, a pattern of a memory cell for one memory cell unit of the memory cell array region 1 is identical to a pattern of a dummy cell region of the power wiring region 2 including a normal image and a mirror image, and both patterns present a line symmetrical relationship with respect to the boundary line BC2.

<Effect>

In the semiconductor device according to the first embodiment, a dummy cell having the same shape as the shape of the memory cell in the memory cell array region 1 is formed including a normal image and a mirror image in the power wiring region 2 where a pattern dimension of a mask pattern for forming a memory cell is conventionally larger than in the memory cell array region 1.

Accordingly, a difference between coarse and fine portions of the pattern dimension is not made at all between the memory cell array region 1 and the power wiring region 2. Thus, the semiconductor device according to the first embodiment is manufactured by using a mask pattern for forming a memory cell which has a wholly uniform pattern dimension.

In the case where a resist is thus subjected to patterning with a mask pattern making no difference between coarse and fine portions after an exposing step using a photomask, the patterning can be performed with high precision without blurring a pattern boundary. Therefore, the patterning controllability of the memory cell of the memory cell array region 1 can be enhanced considerably. As a result, the yield of the device can be enhanced.

In addition, the dummy cell is formed in the power wiring region 2 such that it has a pattern which is line symmetrical with the pattern of the memory cell of the memory cell array region 1 with respect to the boundary line between the memory cell array region 1 and the power wiring region 2. Consequently, the difference between coarse and fine portions of the pattern dimension is not made at all in a vicinal region of the boundary between the memory cell array region 1 and the power wiring region 2. Therefore, the patterning controllability of the memory cell of the memory cell array region 1 can be enhanced still more.

Furthermore, a contact is provided in the region electrically connected to the p-type substrate 9 in the dummy cell formed under the power wiring region 2, thereby performing an electrical connection with the power wiring. Consequently, the substrate potential fixation of the p-type substrate 9 can be carried out and the stability of a circuit operation can also be enhanced.

In the semiconductor device according to the first embodiment, moreover, a dummy cell having the same pattern as the pattern of the memory cell in the memory cell array region 1 is also formed including a normal image and a mirror image under the peripheral dummy cell region 3.

Accordingly, the semiconductor device according to the first embodiment is manufactured by using a mask pattern for forming a memory cell which has a wholly uniform pattern dimension between the memory cell array region 1 and the peripheral dummy cell region 3. Therefore, the patterning controllability of an element constituting area of the memory cell array region 1 can further be enhanced.

In addition, the dummy cell region is formed in the peripheral dummy cell region 3 such that it has a pattern which is line symmetrical with the pattern of the memory cell of the memory cell array region 1 with respect to the boundary line between the memory cell array region 1 and the peripheral dummy cell region 3. Consequently, the difference between coarse and fine portions of the pattern dimension is not made at all in a vicinal region of the boundary between the memory cell array region 1 and the peripheral dummy cell region 3. Therefore, the patterning controllability of the memory cell of the memory cell array region 1 can further be enhanced.

Since the memory cell in the memory cell array region 1 has the same shape as the shape of the dummy cell in the power wiring region 2 including a normal image and a mirror image, a region to be prepared in the memory cell array region 1 can be changed into the power wiring region 2 or a region to be prepared in the power wiring region 2 can be changed into the memory cell array region 1 in a design stage. Thus, manufacture can be performed with flexibility.

For example, when the semiconductor device according to the first embodiment is to be manufactured by using a master slice method, element components of a memory cell (dummy cell) are formed at a master step and a wiring pattern of a mask (slice mask) to be used at a slice step is then changed. Thus, portions where the memory cell array region 1 and the power wiring region 2 are to be formed can properly be changed.

<<Second Embodiment>>
<Whole Structure>

Figure 12:
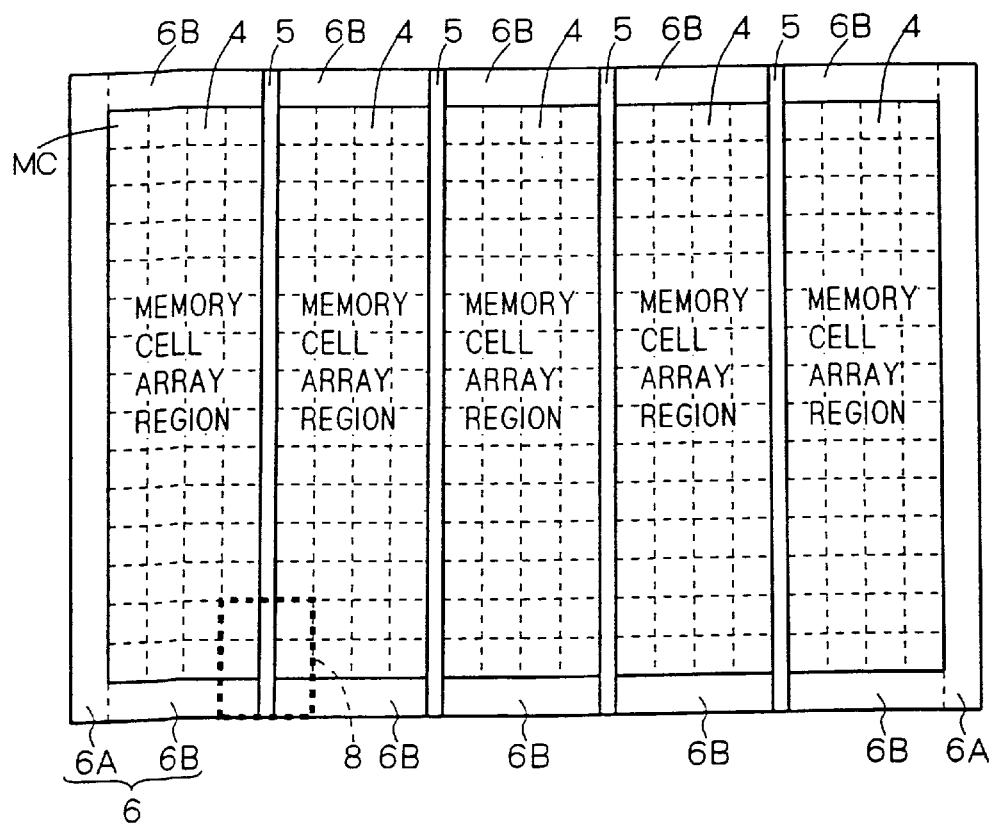
FIG. 12 is a diagram showing the whole layout structure of a semiconductor memory (DRAM) according to a second embodiment of the present invention.
Figure 13:
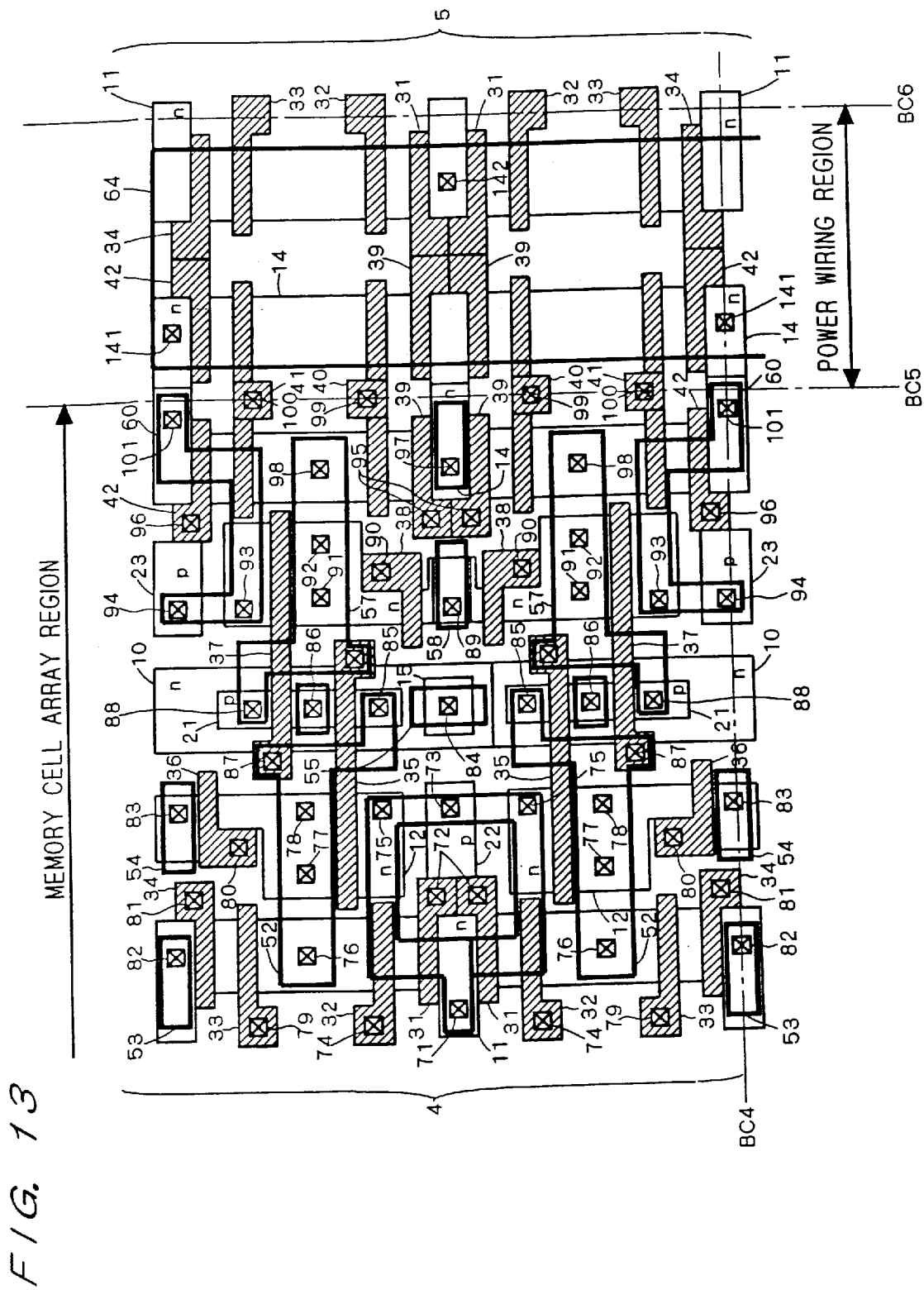
FIGS. 13 to 16 are plan views showing a partial layout structure according to the second embodiment, including a memory cell region, a power wiring region and a peripheral dummy cell region.
Figure 14:
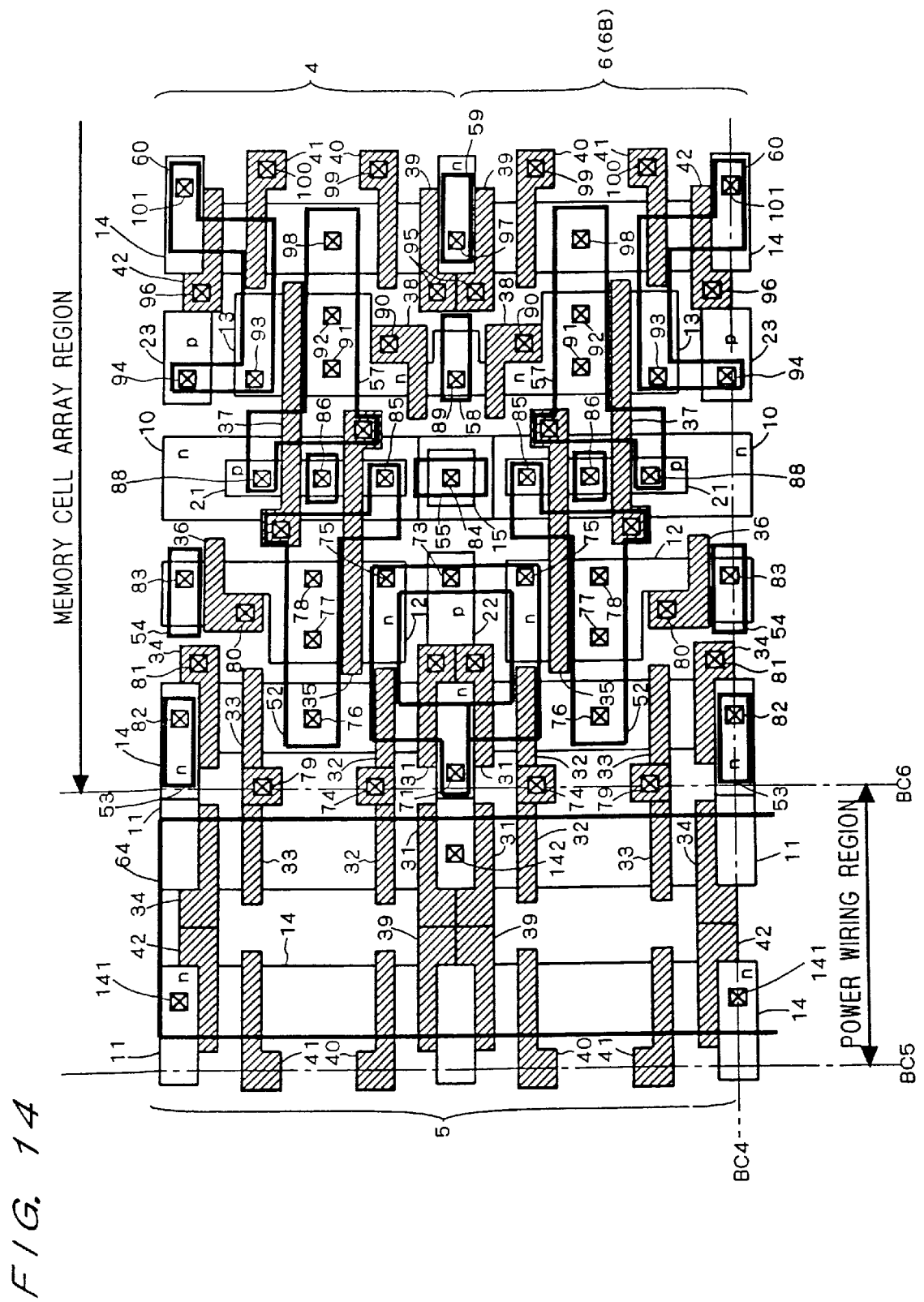
Figure 15:
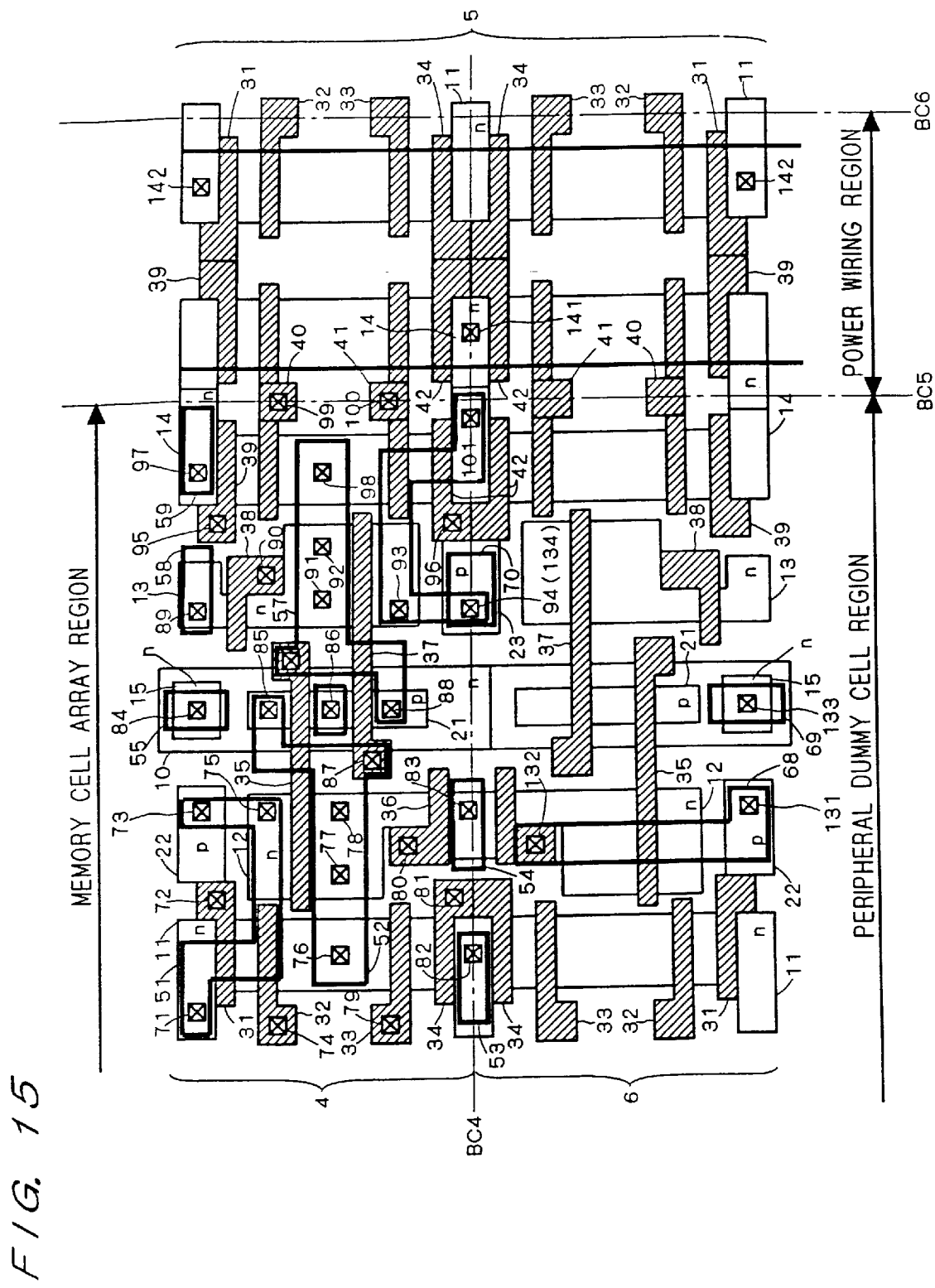
Figure 16:
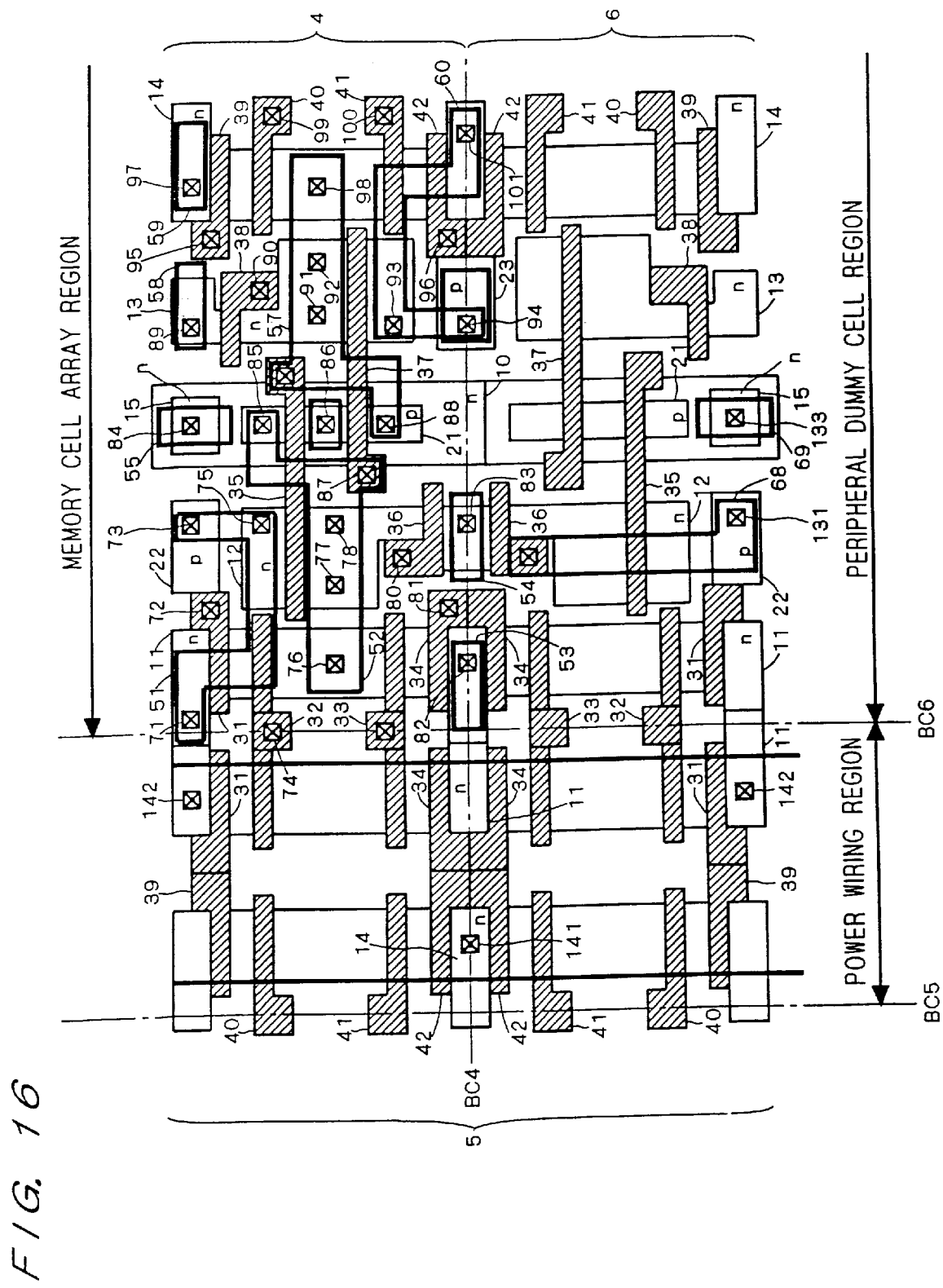

FIG. 12 is a diagram showing the whole layout structure of a semiconductor device according to a second embodiment of the present invention. As shown in FIG. 12, a plurality of memory cell array regions 4, a plurality of power wiring regions 5 and a plurality of peripheral dummy cell regions 6 are arranged in a layout on a p-type substrate which is not shown. The memory cell array region 4 and the power wiring region 5 are alternately provided adjacently to each other. More specifically, the layout arrangement is carried out such that the power wiring region 5 is always inserted between the memory cell array regions 4, 4. Moreover, the peripheral dummy cell region 6 is provided adjacently to the memory cell array region 4 on a periphery of the memory cell array region 4 where the power wiring region 5 is not formed.

A plurality of memory cells MC are provided in an array in the memory cell array regions 4, respectively.

The peripheral dummy cell region 6 is constituted by first partial dummy cell regions 6A provided adjacently to each other in a row direction (a transverse direction in FIG. 12) and second partial dummy cell regions 6B provided adjacently to each other in a column direction (a longitudinal direction in FIG. 12).

Thus, the layout of the semiconductor device according to the second embodiment is almost the same as in the first embodiment. According to the second embodiment, a formation width of the power wiring region 5 is set smaller than that of the power wiring region 5 in the first embodiment.

<Partial Layout>

Figure 17:
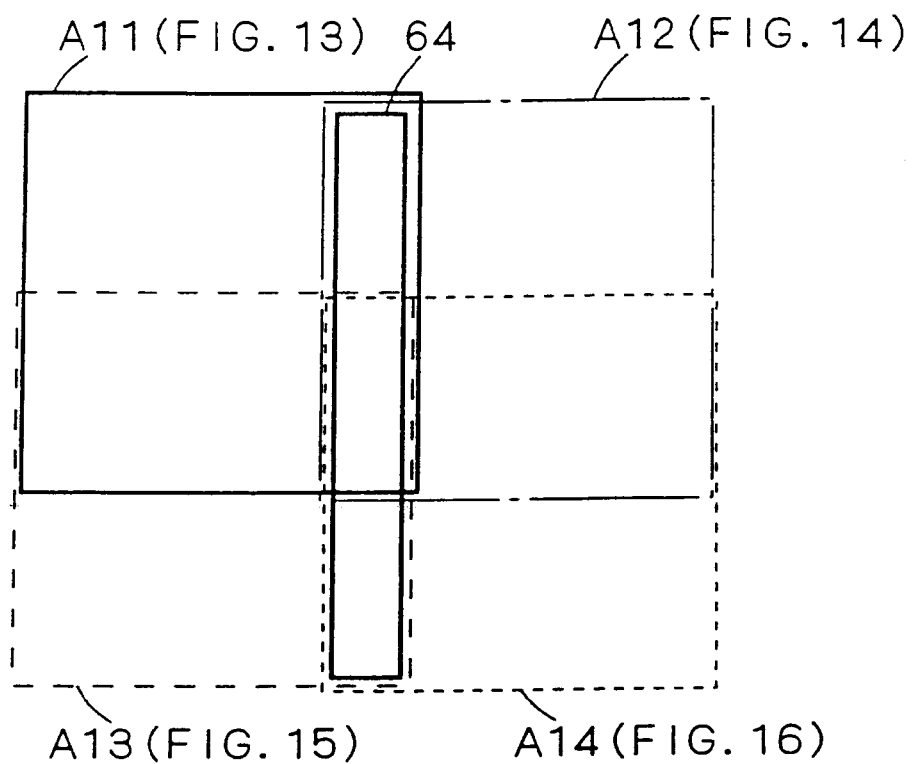
FIG. 17 is a diagram illustrating a positional relationship among FIGS. 13 to 16.

FIGS. 13 to 16 are plan views showing a partial layout structure including the memory cell array region 4, the power wiring region 5 and the peripheral dummy cell region 6. A partial layout region shown in FIGS. 13 to 16 corresponds to a partial region 8 shown in FIG. 12, for example. A positional relationship among FIGS. 13 to 16 is shown in FIG. 17.

As shown in FIGS. 13 to 16, the memory cell array region 4 and the power wiring region 5 are adjacent to each other through a boundary line BC5 and a boundary line BC6, and the memory cell array region 4 and the peripheral dummy cell region 6 are adjacent to each other through a boundary line BC4.

A layout structure of a memory cell for one memory cell unit of the memory cell array region 4 is identical to the layout structure for one memory cell unit of the memory cell array region 4 according to the first embodiment shown in FIG. 2 including a normal image and a mirror image, and a structure of a dummy cell corresponding to one memory cell unit of each of the first partial dummy cell regions 6A and 6B of the peripheral dummy cell region 6 is identical to that of the dummy cell of each of the first partial dummy cell regions 3A and 3B of the peripheral dummy cell region 3 shown in FIGS. 5 and 6 including a normal image and a mirror image.

A layout pattern of element components (active regions 10 to 15 and 21 to 23 and polysilicon regions 31 to 42) of a memory cell for one memory cell unit of the memory cell array region 4 is identical to the pattern of the dummy cell of the peripheral dummy cell region 6 including a normal image and a mirror image, and both patterns present a line symmetrical relationship with respect to the boundary line BC4.

In addition, a pattern of a part of element components (n-type active regions 11 and 14 and polysilicon regions 31 to 34 and 39 to 42) of the memory cell for one memory cell unit of the memory cell array region 4 is identical to a pattern of a dummy cell of the power wiring region 5 including a normal image and a mirror image, and both patterns present a line symmetrical relationship with respect to the boundary lines BC4 and BC5 in a vicinal region thereof.

Moreover, a formation width of the power wiring region 5 is reduced. Therefore, only an aluminum wiring region 64 is formed in the power wiring region 5. The aluminum wiring region 64 is electrically connected to the n-type active regions 14 and 11 through contact holes 141 and 142.

The aluminum wiring region 64 is formed on a first layer and functions as a power wiring for setting a ground potential. Accordingly, the substrate potential fixation of a p-type substrate 9 can be implemented by performing the GND potential fixation of the n-type active regions 11 and 14 through the aluminum wiring region 64. Another metal aluminum wiring formed as a power wiring on a second layer (provided on the first layer) for intensifying a source potential has the same width as the width of the aluminum wiring region 64, which is not shown in FIGS. 13 to 16.

<Effect>

In the semiconductor device according to the second embodiment, a dummy cell having the same pattern as a part of the pattern of the memory cell in the memory cell array region 4 is formed including a normal image and a mirror image in the power wiring region 5 where a pattern dimension of a mask pattern for forming a memory cell is conventionally larger than in the memory cell array region 4.

Accordingly, a difference between coarse and fine portions of the pattern dimension is rarely made between the memory cell array region 4 and the power wiring region 5. Thus, the semiconductor device according to the second embodiment is manufactured by using a mask pattern for forming a memory cell which has an almost wholly uniform pattern dimension. Consequently, the patterning controllability of the memory cell of the memory cell array region 4 can be enhanced.

In addition, the dummy cell is formed in the power wiring region 5 such that it has a pattern which is line symmetrical with the pattern of a part of the memory cell of the memory cell array region 4 with respect to the boundary line between the memory cell array region 4 and the power wiring region 5. Consequently, the difference between coarse and fine portions of the pattern dimension is not made at all in a vicinal region of the boundary between the memory cell array region 4 and the power wiring region 5. Therefore, the patterning controllability of the memory cell of the memory cell array region 4 can be enhanced still more.

Furthermore, a contact is provided in the region electrically connected to the p-type substrate 9 in the dummy cell region formed under the power wiring region 5, thereby performing an electrical connection with the power wiring. Consequently, the substrate potential fixation of the p-type substrate 9 can be carried out and the stability of a circuit operation can also be enhanced.

In the semiconductor device according to the second embodiment, moreover, a dummy cell having the same shape as the shape of the memory cell in the memory cell array region 4 is formed including a normal image and a mirror image under the peripheral dummy cell region 6.

Accordingly, the semiconductor device according to the second embodiment is manufactured by using a mask pattern for forming a memory cell which has a wholly uniform pattern dimension between the memory cell array region 4 and the peripheral dummy cell region 6. Therefore, the patterning controllability of the memory cell of the memory cell array region 4 can further be enhanced.

In addition, the dummy cell is formed in the peripheral dummy cell region 6 such that it has a pattern which is line symmetrical with the pattern of the memory cell of the memory cell array region 4 with respect to the boundary line between the memory cell array region 4 and the peripheral dummy cell region 6. Consequently, the difference between coarse and fine portions of the pattern dimension is not made at all in a vicinal region of the boundary between the memory cell array region 4 and the peripheral dummy cell region 6. Therefore, the patterning controllability of the memory cell of the memory cell array region 4 can further be enhanced.

Furthermore, a formation width of the power wiring region 5 is more reduced than in the first embodiment, and an integration degree can correspondingly be enhanced.

While the invention has been described in detail, the foregoing description is in all aspects illustrative and not restrictive. It is understood that numerous other modifications and variations can be devised without departing from the scope of the invention.

What is claimed is:

1. A semiconductor device comprising:
a semiconductor substrate;
a circuit region formed on said semiconductor substrate and having a circuit portion receiving a power supply potential for operating; and
a circuit adjacent region provided on said semiconductor substrate adjacently to said circuit region and having a dummy portion;
wherein a pattern of at least a part of said dummy portion of said circuit adjacent region is formed to have a line symmetrical relationship with a pattern of at least a part of said circuit portion with respect to a boundary line between said circuit region and said circuit adjacent region in a vicinal region of said boundary line.

2. The semiconductor device according to claim 1, wherein said dummy portion is formed with a same pattern as said circuit portion, said same pattern including a normal image and a mirror image.

3. The semiconductor device according to claim 1, wherein said dummy portion includes a substrate potential setting portion configured to set a substrate potential of said semiconductor substrate to a fixed potential.

4. The semiconductor device according to claim 1, wherein said circuit adjacent region is formed enclosing a periphery of said circuit region.

5. A semiconductor device comprising:
a semiconductor substrate;
a circuit region formed on said semiconductor substrate and having a circuit portion receiving a power supply potential for operating; and
a power wiring region provided on said semiconductor substrate adjacently to said circuit region and having a power wiring for providing said power supply potential,
wherein said power wiring region includes a dummy portion having a pattern dimension equal to a pattern dimension of said circuit portion.

6. The semiconductor device according to claim 5, wherein a pattern of at least a part of said dummy portion is formed to have a line symmetrical relationship with a pattern of at least a part of said circuit portion with respect to a boundary line between said circuit region and said power wiring region in a vicinal region of said boundary line.

7. The semiconductor device according to claim 5, wherein said dummy portion is formed with a same pattern as said circuit portion, said same pattern including a normal image and a mirror image.

8. The semiconductor device according to claim 5, wherein said dummy portion includes a substrate potential setting portion which is electrically connected to said power wiring and configured to set a substrate potential of said semiconductor substrate to a potential of said power wiring.

9. The semiconductor device according to claim 5, wherein said circuit region includes a plurality of first regions each having the circuit portion and said power wiring region includes a plurality of second regions, said plurality of first regions and said plurality of second regions being alternately formed adjacently for each region.

10. The semiconductor device according to claim 5, wherein said power wiring includes a first power wiring for supplying a power source potential and a second power wiring for supplying a ground potential.

11. The semiconductor device according to claim 10, wherein
said circuit region has a wiring for a circuit portion which constitutes said circuit portion, and
a formation width of each of said first and second power wiring is set greater than that of said wiring for a circuit portion.

* * * * *